(12) United States Patent
Wong et al.

(10) Patent No.: US 7,337,534 B2
(45) Date of Patent: Mar. 4, 2008

(54) SMD CHIP HANDLING APPARATUS

(76) Inventors: Chi Ming Wong, 80 Alton Towers Circle, Scarborough, Ontario (CA) M1V 5E8; Woon-Wai Chan, 73 Cairncross Cresent, Markham, Ontario (CA) L3S 3V1

( * ) Notice: Subject to any disclaimer, the term of this patent is extended or adjusted under 35 U.S.C. 154(b) by 449 days.

(21) Appl. No.: 11/100,585

(22) Filed: Apr. 7, 2005

(65) Prior Publication Data

US 2006/0225270 A1    Oct. 12, 2006

(51) Int. Cl.
*B23P 19/00*    (2006.01)
(52) U.S. Cl. ............... 29/739; 29/740; 29/741; 29/744; 29/840; 228/180.21; 228/41
(58) Field of Classification Search ............ 29/29, 29/739–744, 840, 843; 219/85.16, 85.19, 219/121.63, 75, 85.5; 228/41, 51–52, 111.5, 228/244
See application file for complete search history.

(56) References Cited

U.S. PATENT DOCUMENTS

| | | | | |
|---|---|---|---|---|
| 4,759,124 A | * | 7/1988 | Snyder et al. ............. 29/834 |
| 4,858,974 A | * | 8/1989 | Stannek ..................... 294/2 |
| 4,860,438 A | * | 8/1989 | Chen ........................ 29/740 |
| 5,193,269 A | * | 3/1993 | Dattilo ..................... 29/764 |
| 5,199,151 A | * | 4/1993 | Wentworth et al. ....... 29/437 |
| 5,977,512 A | * | 11/1999 | Azdasht et al. ...... 219/121.63 |
| 5,992,725 A | * | 11/1999 | Egawa et al. ............. 228/4.5 |
| 6,915,940 B2 | * | 7/2005 | Zakel et al. ............... 228/41 |

\* cited by examiner

*Primary Examiner*—Minh Trinh
(74) *Attorney, Agent, or Firm*—David W. Wong

(57) ABSTRACT

The apparatus is for securely fetching and positioning an SMD chip on a printed circuit board and soldering the same to the board. Two spring plates form the clasping fingers which are wedged apart to a width larger than the width of the SMD chip by an expander formed on an elongated rod slidably mounted within a vertical tubular housing. An SMD chip may be safely fetched by pressing the rod on the top of the SMD with a continuous depressing motion until the fingers clasp the SMD chip safely therebetween. A soldering unit with a bifurcate soldering head located juxtaposed to the fingers is operative to solder the SMD chip to the printed circuit board while the SMD chip is safely held in place.

7 Claims, 5 Drawing Sheets

SMD CHIP HANDLING APPARATUS

BACKGROUND OF THE INVENTION

1. Field of the Invention

This invention relates to an apparatus for holding and soldering a miniature size chip component on a printed circuit board and more particularly relates to a portable device for facilitating electronic hobbyists and circuit developers in surface mounting and soldering a miniature SMD chip component on a printed circuit board or de-soldering it therefrom.

2. Background Art

Heretofore, it has been problematic for an electronic hobbyist and circuit developer in handling and soldering a surface mounted device, commonly referred to as an SMD chip, on a printed circuit board in fabricating a prototype electronic circuit. Generally, an SMD chip has the physical dimensions of 0.12 inch by 0.06 inch or 0.08 inch by 0.05 inch or 0.04 inch by 0.02 inch, and a height of about 0.025 inch. With such extremely small physical dimensions, it is very difficult and awkward to fetch and to place the SMD chip at a selected position on the printed circuit board, and maintaining it in position while soldering it onto the board. A pair of tweezers are commonly employed for manually picking up an SMD chip and placing it on the printed circuit board, and/or other means must be employed for retaining it in place while soldering it to the board otherwise the chip would be displaced from the desired position by the melted solder. Firstly, considerable care must be exercised in picking up an SMD chip with the tweezers, as the chip would fall off the tweezers if an insufficient clamping force is applied; on the other hand, the SMD chip would readily pop out from the tweezers if too much force is applied. Furthermore, the manual operation of maintaining the chip in place with the tweezers or other holding means during soldering, is also extremely difficult to carry out since the tweezers or holding means must be held in place, while having simultaneously to feed solder with a solder wire to the chip and to apply heat to the solder with a soldering iron. All these different tasks may not be carried out simultaneously by a single person.

Devices employing vacuum suction and/or pre-coated adhesive applied on the printed circuit board for resolving the above problems have been proposed. However, such devices are very complex in construction, and are still difficult to operate; and moreover they are far too expensive to acquire by a hobbyist or an individual electronic circuit developer for making prototype electronic circuits.

OBJECTS AND SUMMARY OF THE INVENTION

It is therefore an object of the present invention to provide an apparatus for fetching an SMD chip effectively.

It is another object of the present invention to provide a portable apparatus operative manually for fetching and positioning an SMD chip on a printed circuit board with ease.

It is another object of the present invention to provide an apparatus operative for fetching, positioning and retaining an SMD chip on a printed circuit board for soldering purposes.

It is another object of the present invention to provide a portable manually operative apparatus for fetching, positioning, retaining and soldering an SMD chip on a printed circuit board.

It is yet another object of the present invention to provide a portable manually operative apparatus for retaining an SMD chip safely in place for de-soldering it from a printed circuit board and removing it therefrom.

It is still another object of the present invention to provide a manually operative apparatus which is simple in structure and easy to operate.

It is still another object of the present invention to provide a manually operative portable apparatus which is cost effective for hobbyists and an individual circuit developers to acquire.

BRIEF DESCRIPTION OF THE DRAWINGS

The description of the invention which follows, together with the accompanying drawings should not be construed as limiting the invention to the example shown and described, because those skilled in the art to which this invention appertains will be able to devise other forms thereof within the ambit of the appended claims. In the accompanying drawing

DETAIL DESCRIPTION OF THE PREFERRED EMBODIMENTS

Figure 8:
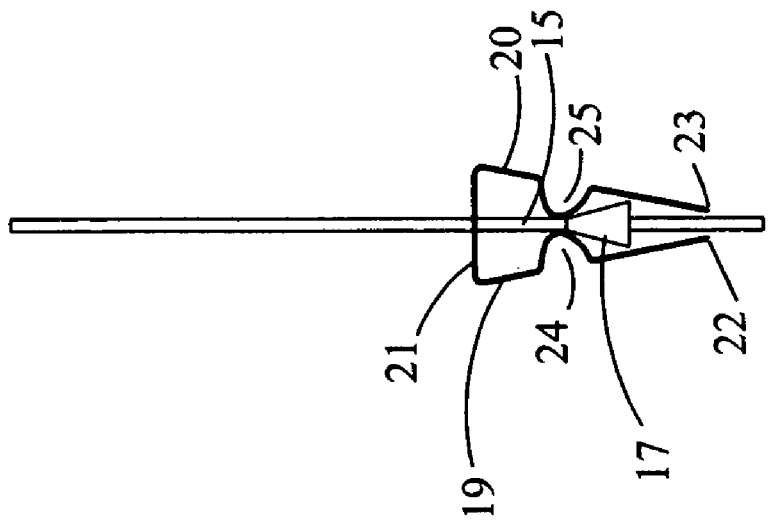
FIG. 8 is an isolated side elevation view of the spring plates and the rod with an expander having an inverted triangular or conical shape.
Figure 7:
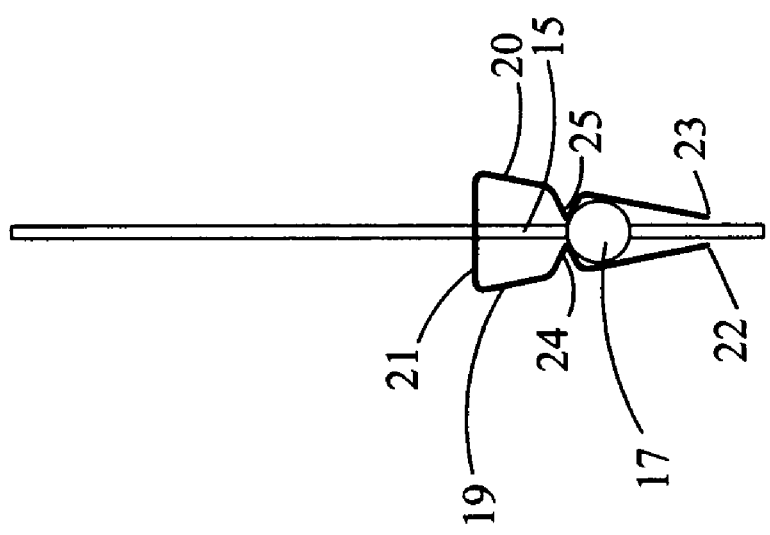
FIG. 7 is an isolated side elevation view of the spring plates and the rod with an expander having a spherical shape.
Figure 6:
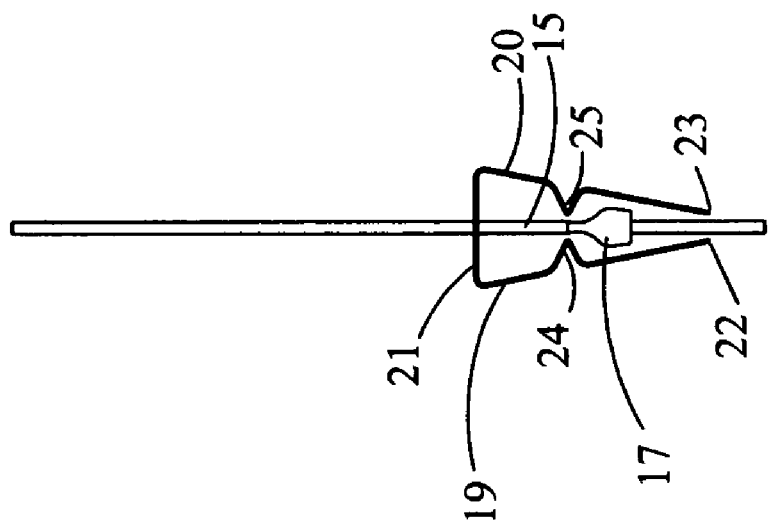
FIG. 6 is an isolated side elevation view of the spring plates and the rod with an expander having a pear shape.

With reference to the accompanying drawings wherein like reference numerals designate corresponding parts in the several views, the apparatus according to the present invention has a main body 10 which may be rectangular in shape as shown. An elongated tubular housing 11 extends vertically upwards from a front portion of the main body 10. In the exemplary embodiment shown, the tubular housing 11 is preferably cylindrical in shape. The tubular housing 11 may be mounted to or integrally formed with the main body 10 by molding. A vertical through channel opening 12 is formed in the tubular housing 11 and the front portion of the main body 10 directly below the tubular housing 11. An elongated rod 13 is slidably mounted within the channel opening 12. An upper portion 14 of the rod 13 extends above the upper end of the tubular housing 11 and its lower end portion 15 extends beyond the lower edge of the main body 10. A button 16 is mounted on the upper end of the rod 13 such that the rod 13 may be operative freely vertically and slidably up or down the tubular housing 11 by pressing or pulling on the button 16. An expander 17 is formed at the lower end portion of the rod 13 and it is located at a short distance from the lower end 18 of the rod 13. The expander 17 preferably has an inverted conical shape as shown with its narrow end pointing upwards. It may alternatively be pear shape, spherical shape or triangular shape as shown in FIGS. 6, 7 and 8.

Two spring plates 19 and 20 extend downwardly adjacent the lower end of the through opening 12 from the main body 10 with their lower ends juxtaposed to one another. The spring plates 19 and 20 may be provided by two inverted triangular shape plates of a generally inverted V-shaped steel spring clasp having a joined upper flat section 21 mounted to the underside of the main body 10. The spring plates 19 and 20 may be rectangular or other similar shape; however, the inverted triangular shape as shown in the preferred embodiment provides a more desirable spring force and durability for the apparatus. The lower ends 22 and 23 of the spring plates 19 and 20 respectively have a width similar to the length of an SMD chip. An inwardly protruding section is formed at the spring plates 19 and 20. The protruding section may be provided by horizontal triangular sections 24 and 25 formed in the spring plates 19 and 20 respectively as shown with the vertexes 26 and 27 of the triangular sections 24 and 25 pointing inwards to touch or to space in close proximity to one another. Alternatively, the protruding section may be an arcuate section as shown in FIG. 8. The vertexes 26 and 27 will be wedged apart by the expander 17 when the rod 13 slides upwards relative to the spring plates 19 and 20 to locate between these vertexes 26 and 27 so as to force the lower edges 22 and 23 of the spring plates 19 and 20 to space apart from one another to a widest width larger than the width of an SMD chip. The expander 17 is located at a position above the lower end of the rod 13 such that when the triangular sections 24 and 25 are wedged apart to the widest width by the expander 17, the lower end 18 of the rod 13 will be located slightly above the lower edges 22 and 23 of the spring plates 19 and 20. Normally, when the expander 17 is located below the triangular sections 24 and 25, the lower end of the rod 13 extends outwards below the lower edges 22 and 23.

A soldering unit 28 is mounted to the main body 10 and extending downwardly therefrom. The housing of the soldering unit 28 may also be integrally formed on the main body 10 by molding. The soldering unit 28 has a bifurcate soldering head 29 extending sideway to locate in close proximity juxtaposed to the lower edges 22 and 23 of the spring plates 19 and 20. An electrical lead 30 conducts the electrical power required for operating the soldering unit 28. The electrical power may be provided by a battery 31 or a step-down transformer connected to the household AC supply.

Figure 1:
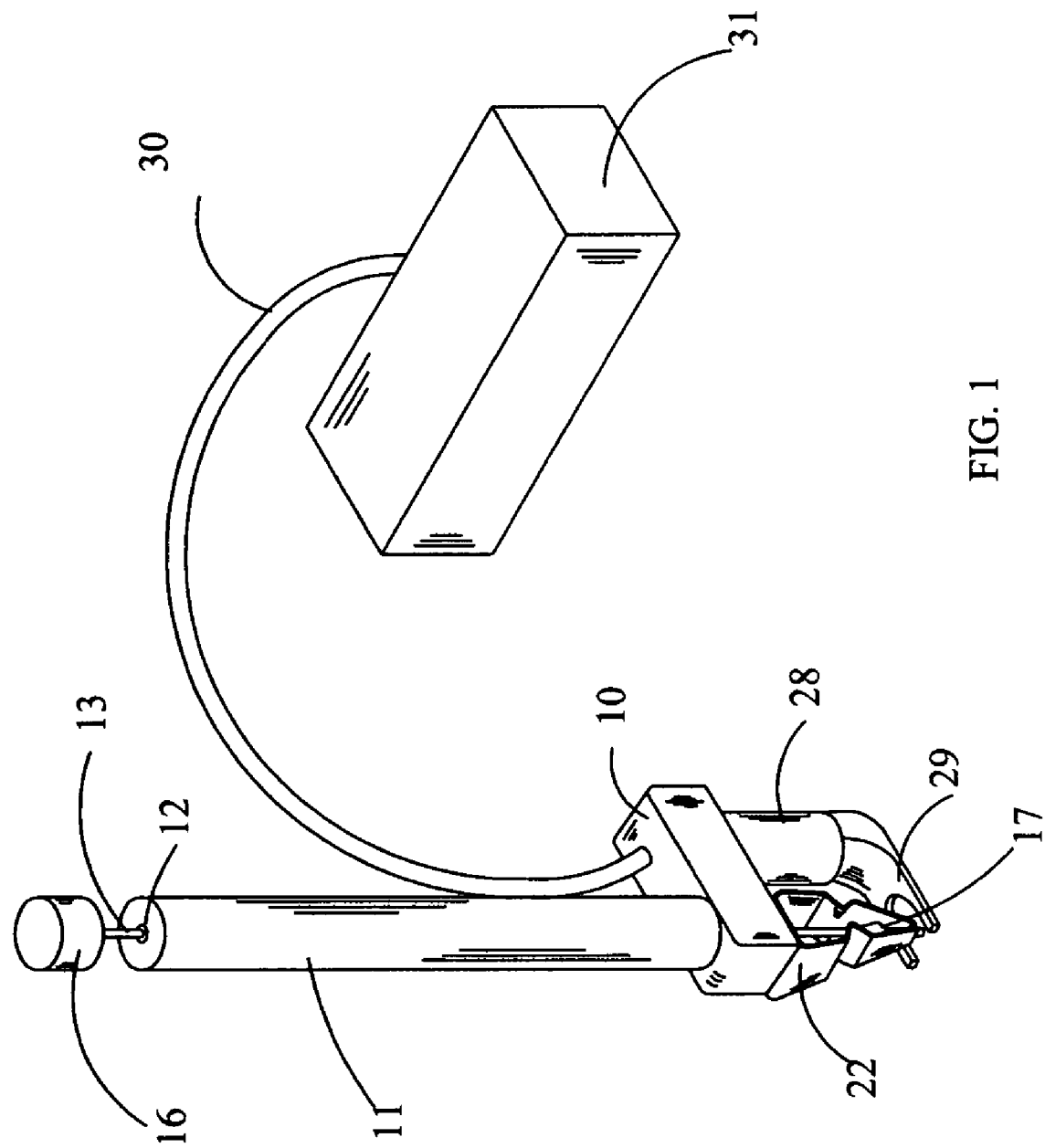
FIG. 1 is a front perspective elevation view of the apparatus according to the present invention.
Figure 4:
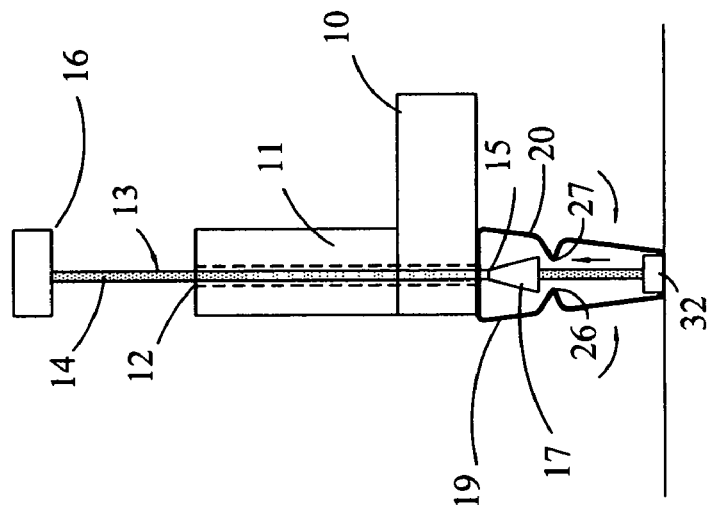
FIGS. 2, 3 and 4 are perspective side elevation view of the chip fetching portion of the apparatus showing the operation of fetching an SMD chip from a support surface.
Figure 3:
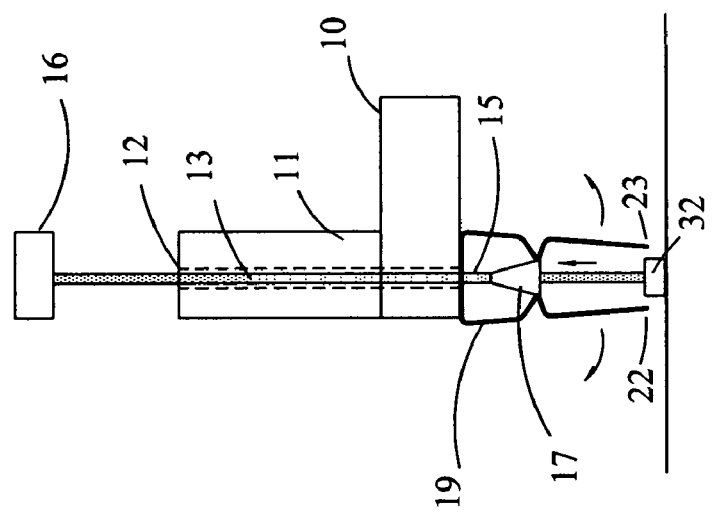
Figure 2:
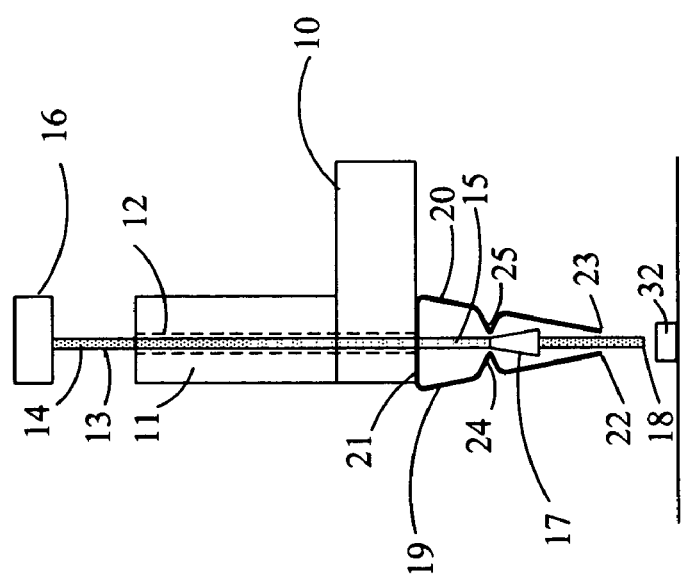
Figure 5:
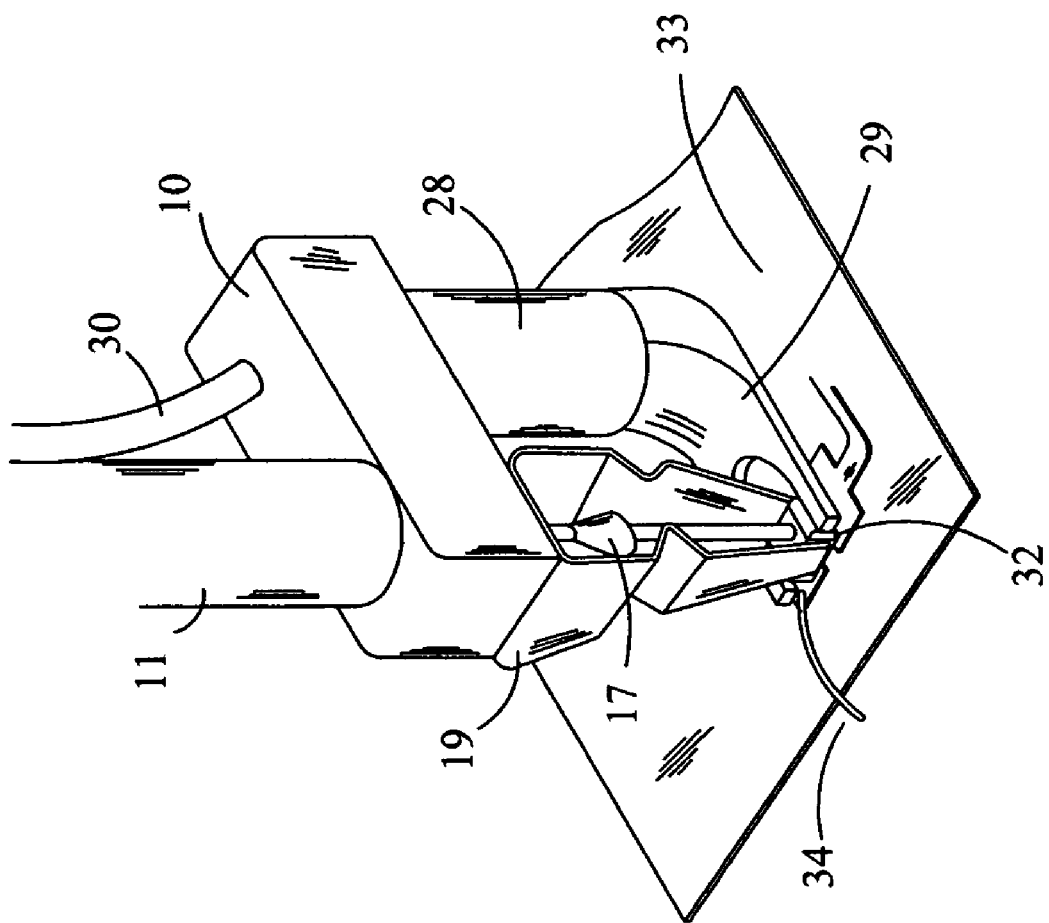
FIG. 5 is an enlarged isolated perspective front view of the combination of the SMD chip fetching and retaining spring plates and soldering head of the present apparatus.

As best shown in FIGS. 2, 3 and 4, an SMD chip 32 lying on a support surface may be fetched by vertically pressing the lower end of the rod 13 on the top of the SMD chip 32 with a continuous depressing motion. The action will first retain the SMD temporarily and securely in place on the support surface by the rod 13. The continuous pressing motion will cause the rod 13 to move effectively upwards relative to the spring plates 19 and 20 until the triangular sections 24 and 25 are wedged apart by the expander 17. At this same moment, the lower edges 22 and 23 will be spaced apart to the widest width larger than the width of the SMD chip 32 to allow the lower edges 22 and 23 to move downwards to locate adjacent to the sides of the SMD chip. When the lower edges 22 and 23 reach the supporting surface, the expander 17 will have slid upwards past the vertexes 26 and 27 and the lower edges 22 and 23 of the spring plates 19 and 20 will snap close to clasp the SMD firmly. The entire operation can be carried out in a continuous motion with the SMD chip 32 constantly held firmly in place on the support surface at all time by the lower end of the rod 13. The spring plates 19 and 20 are designed so that their lower ends will provide the desirable sufficient spring force for holding the SMD chip 32 securely therebetween. The SMD chip 32 may then be carried safely by the apparatus to position onto the selected location on the printed circuit board 33, and it then may be positioned firmly on the printed circuit board 33 by pressing down on the apparatus so that it is restrained in place by the spring plates 19 and 20 as well as being pressed downwards firmly by the rod 13. With the SMD chip 32 now safely placed on the printed circuit board 33, the soldering unit 28 is operated while feeding a fluxed solder wire 34 to the soldering head 29 for soldering the SMD chip 32 onto the printed circuit board 33. Because of the close proximity of the soldering head 29 to the SMD chip 32, the soldering operation may be executed expeditiously. The flux inside the solder wire 34 will evaporate within a short period of time which reduces the flux cleaning reaction.

The present apparatus may also be used for de-soldering an SMD chip from the printed circuit board, which may be carried out by positioning the apparatus onto the SMD chip to be removed for holding the SMD chip in place while the soldering unit 28 is operated to melt the solder therefrom. The melted solder is removed with a suction pump in the conventional manner while the SMD chip is securely held in place. The de-soldered SMD chip may then be removed effectively from the printed circuit board with the SMD chip securely held between the spring plates 19 and 20.

Figure 9:
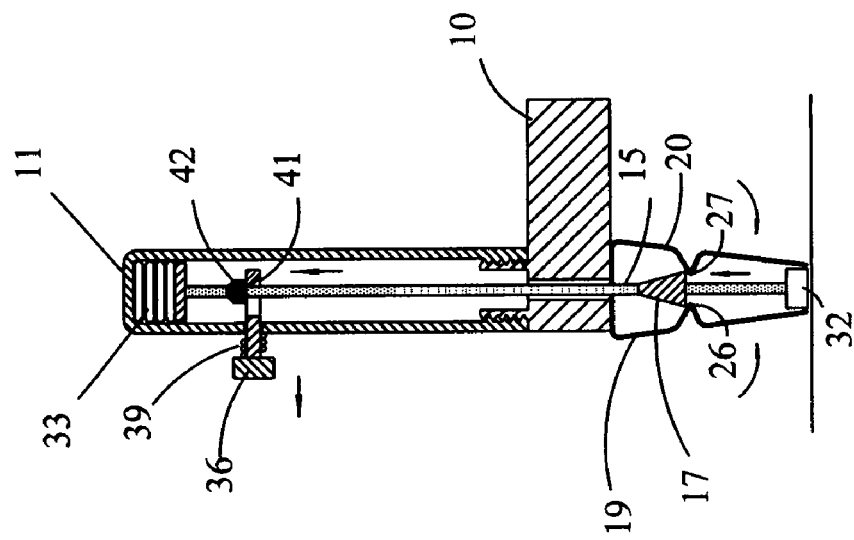
FIGS. 9 through 11 are partial sectional side elevation views of the alternative embodiment of the apparatus of the present invention with a latching mechanism for the rod incorporated in the tubular housing.
Figure 10:
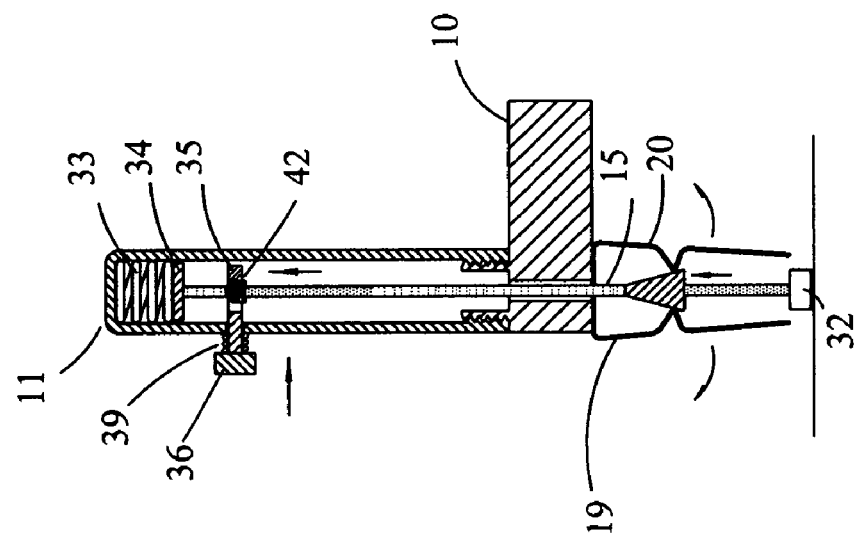
Figure 11:
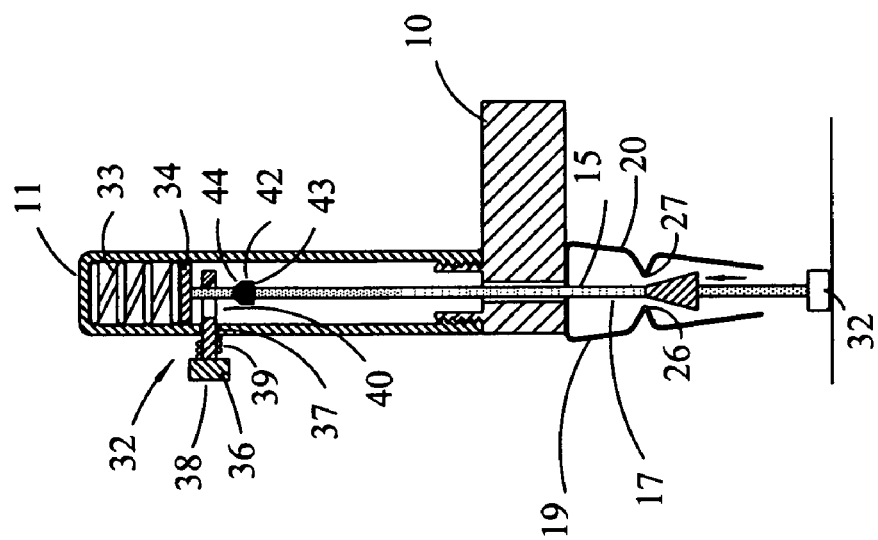

An alternative embodiment of the present apparatus is shown in FIGS. 9 through 11. A spring biassed latch mechanism 32 is incorporated in the tubular housing 11, which normally maintains the rod 13 in the position with its lower end extending outwards below the lower edges of the spring plates 19 and 20. The tubular housing 11 may have a closed upper end and it may be removably mounted to the main body 10 to facilitate repair or replacement of parts in the latch mechanism 32. A compression spring 33 is located within the top end of the tubular housing 11. A slider plate 34 is located between the top end of the rod 13 and the compression spring 33. The slider plate 34 may be alternatively integrally formed on the top end of the rod 13. A latch plate 35 is located in the tubular housing 11 in a horizontal manner and it has a side arm 36 extending horizontally outward slidably through a side opening 37 formed in the tubular housing 11. A push button 38 is mounted at the outer end of the side arm 36, and a compression spring 39 is mounted on the side arm 36 and located between the tubular housing 11 and the push button 38. The compression spring 39 normally urges the side arm 36 to extend outwards. The latch plate 35 may be moved sideways horizontally by pushing the push button 38 to press the side arm 36 inwards against the spring force of the compression spring 39. A latch opening 40 is formed in the latch plate 35. The upper end portion of the rod 13 extends through the latch opening 40. The latch opening 40 preferably has a downwardly sloping inner side wall 41 distal from the side arm 36. An annular retainer 42 is mounted on the rod 13. The annular retainer 42 has a diameter larger than the diameter of the rod but smaller than the diameter of the latch opening 40 and it has a relatively flat horizontal lower surface 43 and a tapered upper surface 44. The annular retainer 42 is mounted at a position on the rod 13 at which when the expander 17 just passes the vertexes 26 and 27 of the spring plates 19 and 20 by pressing the rod 13 on the SMD chip against the spring force of the compression spring 33, the annular retainer 42 will have moved just above the latch opening 40. Since the latch plate 35 is biassed by the compression spring 39, the lower surface 43 of the annular retainer 42 will engage with the upper edge of the latch opening 40 as soon as the annular retainer 42 passes the latch opening 40 to retain the rod 13 at this pushed up position with the SMD chip 32 already clasped firmly by the lower edges 22 and 23 of the spring plates 19 and 20. The rod 13 may be returned to the lower position by pressing the push button 38 inwards against the spring force of the compression spring 39 to disengage the annular retainer 42 from the latch opening 40 such that the spring force of the compression spring 33 will push the rod 13 to return to the lower position with its lower end extending outwards below the lower edges 22 and 23 of the spring plates 19 and 20. The tapered upper surface 44 of the annular retainer 42 and the downwardly sloping inner side wall 41 of the latch opening 40 facilitate the sliding movement of the annular retainer 42 through the latch opening 40 during the latching operation.

Thus the several aforementioned objects and advantages are most effectively attained. Although the preferred embodiments of the invention have been disclosed and described in detail herein, it should be understood that this invention is in no sense limited thereby and its scope is to be determined by that of the appended claims.

What is claimed is:

1. An apparatus for handling an SMD chip comprising:
   a main body,
   a tubular housing extending upwards vertically from said main body,
   an elongated vertical through channel opening extending throughout said tubular housing and said main body,
   an elongated rod extending slidably within said through channel opening, and having an upper end portion therein extending above a top end of said tubular housing and a lower end portion extending below a lower edge of said main body,
   an expander formed on said lower end portion of said rod and located above a lower end of said rod,
   two triangular shape spring plates mounted on said main body and extending downwardly below said lower edge of said main body in a convergent manner adjacent to said through channel opening with lower end edges of said spring plates normally in close proximity to one another,
   horizontal inwardly protruding sections formed in said spring plates, said protruding sections having inwardly pointing vertexes normally located in close proximity directly opposite to one another, and said vertexes being engageable with and wedged apart by said expander by moving said rod upwards to an upper position relative to said tubular housing to locate said expander at a wedging position between said vertexes, said lower end edges of said spring plates being spaced apart to a widest width larger than a width of said SMD chip when said vertexes are wedged apart by said expander, and when said rod is in said upper position with a lower end of said rod being located just above said lower end edges of said spring plates,
   a soldering unit having a housing extending downward from said main body, said soldering unit having a bifurcated soldering head located juxtaposed to said lower end edges of said spring plates.

2. The apparatus according to claim 1 including a press button mounted on an upper end of said rod, and said expander has an inverted conical shape.

3. The apparatus according to claim 2 including a power supply connected to said soldering device by an electrical lead wire.

4. The apparatus according to claim 3 wherein said spring plates are two downwardly extending plates of an inverted V-shaped spring clasp having an upper horizontal flat section mounted to an underside of said main body.

5. The apparatus according to claim 4 including a latching mechanism incorporated in said tubular housing and operative for retaining said rod at an upper position.

6. The apparatus according to claim 1 wherein said expander has a spherical shape.

7. The apparatus according to claim 1 wherein said expander has a pear shape.

* * * * *